(12) United States Patent
Myoung et al.

(10) Patent No.: US 8,227,348 B2
(45) Date of Patent: Jul. 24, 2012

(54) METHOD FOR PATTERNING NANOWIRES ON SUBSTRATE USING NOVEL SACRIFICIAL LAYER MATERIAL

(75) Inventors: Jae Min Myoung, Koyangsi (KR); Jyoti Prakash Kar, Seoul (KR)

(73) Assignee: Industry-Academic Corporation Foundation, Yonsei University, Seoul (KR)

( * ) Notice: Subject to any disclaimer, the term of this patent is extended or adjusted under 35 U.S.C. 154(b) by 738 days.

(21) Appl. No.: 12/349,164

(22) Filed: Jan. 6, 2009

(65) Prior Publication Data
US 2010/0116780 A1 May 13, 2010

(30) Foreign Application Priority Data

Nov. 12, 2008 (KR) .......................... 10-2008-112055

(51) Int. Cl.
*H01L 21/302* (2006.01)
*H01L 21/461* (2006.01)
(52) U.S. Cl. ......... 438/689; 438/694; 438/696; 438/745
(58) Field of Classification Search ....................... None
See application file for complete search history.

(56) References Cited

U.S. PATENT DOCUMENTS

| | | | | |
|---|---|---|---|---|
| 5,310,696 A | * | 5/1994 | McCann et al. | ................ 117/58 |
| 2005/0110923 A1 | * | 5/2005 | Yamashita et al. | ............ 349/107 |
| 2005/0127421 A1 | * | 6/2005 | Seidl et al. | .................... 257/300 |
| 2008/0264185 A1 | * | 10/2008 | Kobayashi et al. | ...... 73/862.637 |

OTHER PUBLICATIONS

S. Mukherjee, et al., Strain Oriented Microstructural Change During the Fabrication of Free-Standing PbSe Micro-rods, J Mater Sci: Mater Electron, Mar. 2008, vol. 19, pp. 237-240, Spring Science+Business Media, LLC.

* cited by examiner

*Primary Examiner* — Duy Deo
(74) *Attorney, Agent, or Firm* — Rosenberg, Klein & Lee

(57) ABSTRACT

A method for patterning nanowires on a substrate. The method includes procedures of preparing a substrate having a patterned sacrificial layer of barium fluoride thereon; growing nanowires on an entire surface of the resultant substrate including the patterned sacrificial layer; and removing the patterned sacrificial layer using a solvent to remove part of the nanowires on the patterned sacrificial layer such that part of the nanowires in direct contact with the substrate remains on the substrate to thereby form a nanowire pattern.

11 Claims, 7 Drawing Sheets

STEP-1: Photo-resist coating

STEP-2: Patterning of photo-resist

STEP-3: Growth of sacrificial layer by thermal evaporation

STEP-4: Patterning of sacrificial layer by lift-off of photo-resist

STEP-5: Growth of ZnO nanowires on patterned sacrificial layer

STEP-6: Pattering of ZnO nanowires by removal of sacrificial layer

STEP-1: Photo-resist coating

STEP-2: Patterning of photo-resist

STEP-3: Growth of sacrificial layer by thermal evaporation

STEP-4: Patterning of sacrificial layer by lift-off of photo-resist

STEP-5: Growth of ZnO nanowires on patterned sacrificial layer

STEP-6: Pattering of ZnO nanowires by removal of sacrificial layer

(a)

(b)

METHOD FOR PATTERNING NANOWIRES ON SUBSTRATE USING NOVEL SACRIFICIAL LAYER MATERIAL

CROSS REFERENCE TO RELATED APPLICATIONS

This application claims the benefit under 35 U.S.C. §119 (a) of a Korean application filed in the Korean Intellectual Property Office on Nov. 12, 2008, and there duly assigned Serial No. 10-2008-112055, the entire disclosure of which is hereby incorporated by reference.

STATEMENT REGARDING FEDERALLY SPONSORED RESEARCH

Not Applicable.

APPENDIX

Not Applicable.

BACKGROUND OF THE INVENTION

1. Field of the Invention

The present invention relates to a nanowire patterning method, and more particularly, to a method for growing and patterning nanowires on a substrate using a novel sacrificial material layer.

2. Related Art

A high-temperature growth process is required to synthesize semiconductor nanowires. Some soft nanowires cause etching difficulty during the fabrication of semiconductor devices. Hence, nanowire patterning has been positioning itself as an important technique.

In microelectronics technology, a lift-off process is a patterning process that produces a target material structure on the surface of a substrate using a sacrificial layer. This process is an additive technique unlike a traditional subtracting technique such as etching. The size of the structure produced in this process can be in the range from nanometer to centimeter, but is typically a micrometer scale.

An inverse pattern is firstly formed on a sacrificial stencil layer, which is deposited on the surface of a substrate. This patterning is carried out by etching the sacrificial stencil layer to form holes, and then depositing target material so as to reach the surface of the substrate through the holes, thereby forming a final pattern. The target material is deposited on the entire area of the substrate. Thus, the target material not only reaches the surface of the substrate through the etched areas, i.e. the holes, but also remains on top of the sacrificial stencil layer that is not etched. When the sacrificial stencil layer is removed by cleaning with a solvent, the target material atop the sacrificial stencil layer is lifted off and is cleaned off along with the underlying sacrificial layer. After the lifting off, the target material remains only on the area that is in direct contact with the substrate.

Recently, nanostructures are under intensive study regarding applications as a building block of various nanoscale devices. A great number of studies have been focused on the synthesis of nanostructures, which makes it possible to control geometry, aspect ratio (width-to-height ratio), growth rate and growth direction. Particularly, a high-temperature process absorbs attention since high-temperature environment has a variety of merits such as simple precise control of doping and thickness and the realization of high quality nanowires.

For future-oriented application of nanodevices, selective-area growth and/or post-growth patterning are becoming a big issue. An attempt is made at the selective-area growth on a patterned metal layer. Unfortunately, this attempt limits substrates or electrodes that can be selected for a specific application.

Meanwhile, in the microelectronic industry, a sacrificial layer and/or a lift-off technique have been used for patterning a functional material. Here, a lift-off material (e.g., photoresist) used up to now is not suitable, because a high-temperature growth process is required for the synthesis of nanowires. In detail, such a lift-off material cannot withstand the heat of the high-temperature growth process, and thus burns by the heat.

Meanwhile, in the case where a known sacrificial layer material such as porous silicon, polysilicon, silicon dioxide and polysilicate glass (PSG) is used, a toxic hazardous chemical such as HF has to be used to remove the sacrificial layer. However, the toxic chemical attacks and damages the nanowires. In some cases a ZnO film is also used as a sacrificial layer for the fabrication of microstructures due to its higher etch rate in both acid and alkali chemicals. Therefore, diluted chemicals have a possibility of attacking the nanowires and changing the geometry and size of the nanowires in an active area during a fabrication process.

As such, the use of a suitable soft lift-off/sacrificial layer is becoming a big concern in the fabrication of nano-electronics that use the nanowires as a functional material. While a cheap and soft sacrificial material is required and has stability under high temperature, there is not a sacrificial layer material, particularly a photoresist material, which can meet such requirements and simultaneously be used for stable growth and patterning of the nanowires. Therefore, according to the circumstances of the current technologies, there are still a number of difficulties against the application of nanowires.

SUMMARY OF THE INVENTION

The present invention has been made to solve the foregoing problems with the related art, and an embodiment of the present invention provides a method for stably growing and patterning nanowires at high temperatures using a novel material that can overcome the high-temperature instability of conventional lift-off materials.

An embodiment of the invention provides a method for stably growing and patterning nanowires on a substrate using a novel sacrificial layer material, which is not accompanied by the use of toxic chemicals.

An embodiment of the invention provides a method for growing and patterning nanowires on a substrate using a novel sacrificial layer that can withstand high-temperature environment for the growth of the nanowires and be removed by simply cleaning with a solution (e.g., water) at room temperatures.

An embodiment of the invention provides a method for stably patterning nanowires on a substrate using a sacrificial layer that does not attack the nanowires unlike a conventional sacrificial layer.

An embodiment of the invention provides a novel high-temperature resistant material that can be used as a sacrificial layer in the process for growing and patterning nanowires on a substrate.

In an exemplary embodiment of the invention, a method of patterning nanowires on a substrate may include procedures of preparing a substrate having a patterned sacrificial layer of barium fluoride thereon; growing nanowires on an entire surface of the resultant substrate including the patterned sacrificial layer; and dissolving the patterned sacrificial layer using a solvent to remove part of the nanowires on the patterned sacrificial layer such that part of the nanowires in direct contact with the substrate remains on the substrate to thereby form a nanowire pattern.

In an exemplary embodiment of the invention, the procedure of preparing the substrate may comprise: coating a photoresist on a surface of the substrate; patterning the photoresist on the surface of the substrate; growing barium fluoride on the entire surface of the resultant substrate including the patterned photoresist by thermal deposition, thereby forming a sacrificial layer of barium fluoride; and removing the patterned photoresist by lift-off to remove part of the sacrificial layer on top of the patterned photoresist such that part of the sacrificial layer in direct contact with the substrate remains on the substrate to thereby form the patterned sacrificial layer of barium fluoride.

In an exemplary embodiment of the invention, the patterned photoresist may be removed by acetone.

In an exemplary embodiment of the invention, the procedure of preparing the substrate may comprise: growing barium fluoride on a surface of the substrate by thermal deposition to form a sacrificial layer of barium fluoride; and patterning the sacrificial layer of barium fluoride into a predetermined pattern.

In an exemplary embodiment of the invention, the procedure of preparing the substrate may comprise: depositing barium fluoride on a surface of the substrate by chemical vapor deposition to form a sacrificial layer of barium fluoride; and patterning the sacrificial layer of barium fluoride into a predetermined pattern.

In an exemplary embodiment of the invention, the sacrificial layer of barium fluoride may have a polycrystalline or amorphous surface.

In an exemplary embodiment of the invention, the sacrificial layer of barium fluoride may be stable at a temperature range from room temperature to 1500° C.

In an exemplary embodiment of the invention, the nanowires may have a composition selected from the group consisting of ZnO, GaN and Si.

In an exemplary embodiment of the invention, the nanowires may be grown by chemical vapor deposition or furnace method.

In an exemplary embodiment of the invention, the patterned sacrificial layer of barium fluoride may be removed by deionized water.

In another exemplary embodiment of the invention, a thin film material forming a sacrificial layer used for patterning nanowires on a substrate is barium fluoride.

In an exemplary embodiment of the invention, the sacrificial layer of barium fluoride may be stable at a temperature range from room temperature to 1500° C.

In an exemplary embodiment of the invention, the sacrificial layer of barium fluoride may be removable by a deionized water solvent.

In an exemplary embodiment of the invention, the sacrificial layer of barium chloride may be stable to acetone.

According to the embodiments of the invention, nanowires can be grown and patterned on a substrate using a sacrificial layer of barium fluoride. The sacrificial layer of barium fluoride has high-temperature stability and thus can withstand high-temperature environment associated with the growth of nanowires. Furthermore, since the sacrificial layer of barium fluoride can be easily removed by a chemically non-aggressive solvent such as water, the nanowires are not chemically attacked when the sacrificial layer is being removed. As a result, fine quality nanowires can be patterned into an intended shape.

BRIEF DESCRIPTION OF THE DRAWINGS

The above and other aspects, features and other advantages of certain exemplary embodiments of the present invention will be more apparent from the detailed description taken in conjunction with the accompanying drawings, in which.

DETAILED DESCRIPTION OF THE EXEMPLARY EMBODIMENTS

Figure 1:
FIG. 1 is a schematic representation of a nanowire patterning method according to an exemplary embodiment of the invention.
Figure 1:
Figure 1:
Figure 1:
Figure 1:
Figure 1:

The following description with reference to the accompanying drawings is provided to assist in a comprehensive understanding of exemplary embodiments of the invention as defined by the claims and their equivalents. In the following description, well-known processes in the art, such as photoresist coating and patterning and nanowire growth and patterning carried out on a substrate, will not be described in detail since they would obscure the invention in unnecessary detail.

As described above with respect to the related art, a photoresist used in nanowire patterning cannot withstand high-temperature environment associated with the growth of nanowires. Due to this problem, a method for patterning nanowires on a substrate using a conventional photoresist has not yet been realized. In the case where a sacrificial layer is used, high quality nanowires cannot be patterned on the substrate since a toxic chemical such as HF, which attacks the nanowires, is also required.

In order to solve these problems, the inventors have studied a novel sacrificial layer material that can withstand high-temperature growth environment and be removed by simply cleaning with a solvent, which does not chemically attack nanowires. The inventors have repeatedly carried out experiments by preparing sacrificial layers from a variety of compositions and applying the prepared sacrificial layers to nanowire patterning. As the result of the repeated experiments, the inventors found that those problems associated with the use of a photoresist and a sacrificial layer of the related an can be solved at one stroke when barium fluoride ($BaF_2$) is used as a sacrificial layer material (or a photoresist material in a narrow meaning), and completed the present invention based on this discovery.

Below, a description will be made of a process of the invention with reference to FIG. 1, which is a representation of a process for patterning ZnO nanowires on a substrate by lift-off according to an exemplary embodiment of the invention.

As shown in the drawing, a photoresist is coated on the surface of a substrate (S1). The photoresist can be made of a material same as a conventional photoresist material. Even in this case, nanowires can be patterned thanks to a unique sacrificial layer as described below. Then, the photoresist coated on the substrate is patterned into an intended shape (S2). The techniques of photoresist coating and patterning are well known in the art, and a further description thereof will be omitted.

Next, barium fluoride ($BaF_2$) is grown as a sacrificial layer on the entire surface of the resultant substrate by thermal evaporation (S3). According to an embodiment of the invention, barium fluoride is grown under a pressure from $1 \times 10^{-5}$ to $10^{-6}$ Torr by holding the substrate at room temperature. Subsequently, the sacrificial layer is formed on both the surface of the remaining photoresist coated on the surface of the substrate and the exposed surface of the substrate.

In subsequence, the remaining photoresist is removed from the substrate by lift-off (S4). Here, the remaining photoresist can be removed by using a solvent such as acetone, to which the sacrificial layer of barium fluoride is considerably stable. This is one of important advantages of the invention. As a result of this step, part of the sacrificial layer formed on the photoresist is also removed to thereby form a sacrificial layer pattern on the substrate.

Next, ZnO nanowires are grown on the entire surface of the substrate using for example a Metal Oxide Chemical Vapor Deposition (MOCVD) system (S5). The nanowires can be grown in various conditions as described below, and the technique of growing the nanowires using an MOCVD technique is well-known in the art. The ZnO nanowires grow not only on the exposed surface of the substrate, from which photoresist is removed by lift-off, but also on the surface of the sacrificial layer remaining on the substrate. The sacrificial layer is made of barium fluoride, which can excellently withstand to high-temperature growth environment of the nanowires. This is one important feature of the invention. That is, the sacrificial layer of barium fluoride neither melts in high-temperature environment nor attacks the nanowire area formed on the surface of the substrate (for example the left part of FIG. 7). Accordingly, high quality ZnO nanowires are well grown (see FIG. 7).

Finally, the sacrificial layer is removed to thereby complete the nanowire pattering process (S6). According to the observation of the inventors, barium fluoride is easily removable by cleaning with a solvent such as water (particularly, deionized water), which does not chemically attack nanowires, and thus the nanowire patterning can be easily completed even at room temperature. Unlike the related art, a toxic chemical such as HF is not required. Accordingly, high quality nanowires can be easily patterned (e.g., FIG. 7) since it is free from the conventional problem resulting from the chemical attacking the nanowires.

According to the invention as described above, the sacrificial layer of barium fluoride, which has excellent high-temperature stability, is formed on the entire patterned surface of the substrate, and thereby high quality nanowires can be grown without the problems with the related art. In addition, since the sacrificial layer can be easily removed by using a non-aggressive solvent such as water at room temperature, the nanowires can be easily patterned in an intended shape.

This embodiment shown in FIG. 1 relates to the nanowire patterning process using a lift-off technique. The photoresist can also act as a sacrificial layer in a broad sense. Therefore, the patterning process can be further simplified by growing barium fluoride using the photoresist as a sacrificial layer without using the lift-off technique. Specifically, barium fluoride is grown or deposited on the surface of a substrate using thermal deposition or other known techniques, followed by patterning into an intended shape using a conventional patterning technique. Then, nanowires can be grown or patterned on the entire surface of the resultant substrate according to the above-described method. In other words, according to the invention, the barium fluoride layer is patterned according to the patterning process as illustrated in FIG. 1 or other patterning processes, nanowires are grown on the entire surface of the resultant substrate including the patterned barium fluoride layer, and then the barium fluoride layer is removed to thereby pattern the nanowires into any intended shape. This is enabled by barium fluoride, which was found as a suitable material for the sacrificial layer as the result of intensive and repeated studies of the inventors. Through the studies of the inventors, it was found that the barium fluoride layer has very unique properties: The barium fluoride layer can be easily formed using a relatively inexpensive technique such as thermal deposition, and has a uniform surface due to polycrystalline property. In the process where the photoresist is removed, the barium fluoride layer is not chemically attacked by a certain type of solvent such as, acetone due to its excellent stability to the solvent. Furthermore, it has very excellent high-temperature stability and is very easily removable by a chemically non-aggressive solvent such as water (e.g., deionized water).

Now, the present invention will be described in more detail with reference to experimental examples.

Properties of Sacrificial Layer of Barium Fluoride

Figure 2:
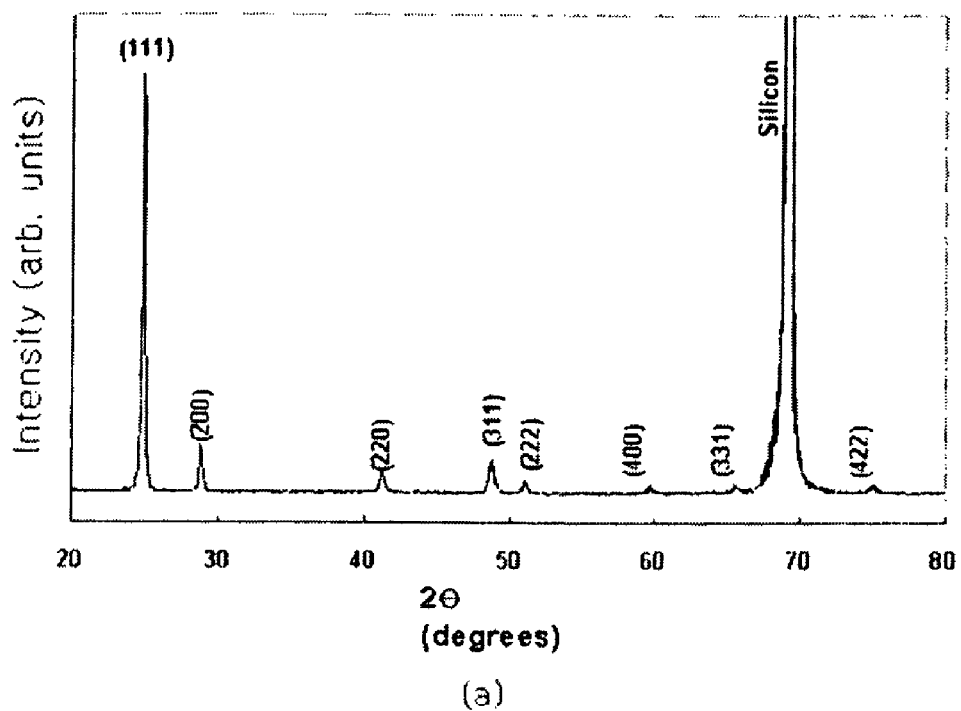
FIG. 2 is a representation of the morphological properties of a sacrificial layer of barium fluoride according to the invention.
Figure 2:
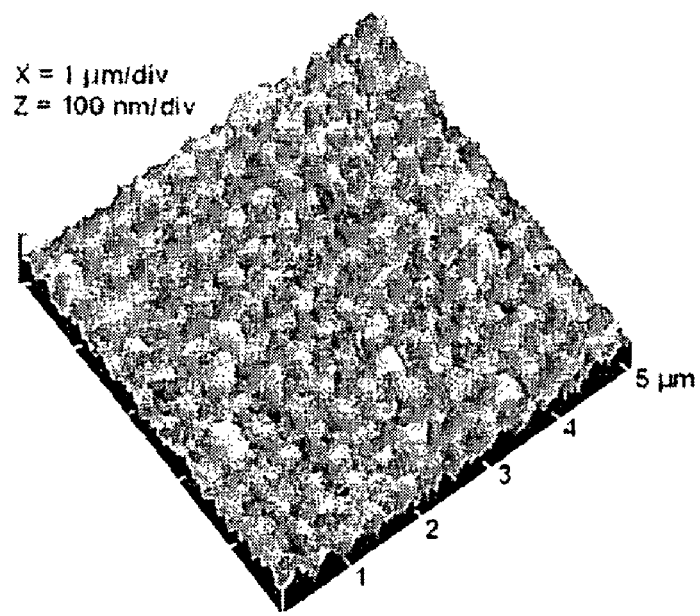

FIG. 2 (a) shows crystallographic properties of a sacrificial layer of barium fluoride. The X-ray diffraction pattern shows that the sacrificial layer of barium fluoride has a polycrystalline property since the peak of the (111) plane is most prominent and other crystallographic planes also appear. These features mean that barium fluoride grew in a variety of crystallographic directions when grown at room temperature. It is apparent that the barium fluoride layer is well crystallized even at room temperature. Furthermore, it is appreciated that the barium fluoride layer as a sacrificial layer of the invention has the same function as a polycrystalline material even if it is amorphous. A 5 µm×5 µm area of a sacrificial layer of barium fluoride film was observed via the Atomic Force Microscopy (AFM) to examine the surface texture of the sacrificial layer, and the result is reported in FIG. 2 (b). Grains and grain boundaries defined thereby appear on the surface. This indicates a high surface roughness resulting from the grains formed on the surface, and this sacrificial layer had a Root Mean Square (RMS) of about 21 nm. However, it can be understood that the function as the sacrificial layer equally appears from an amorphous structure and the surface roughness of the sacrificial layer has no relation with the function of the sacrificial layer.

Figure 3:
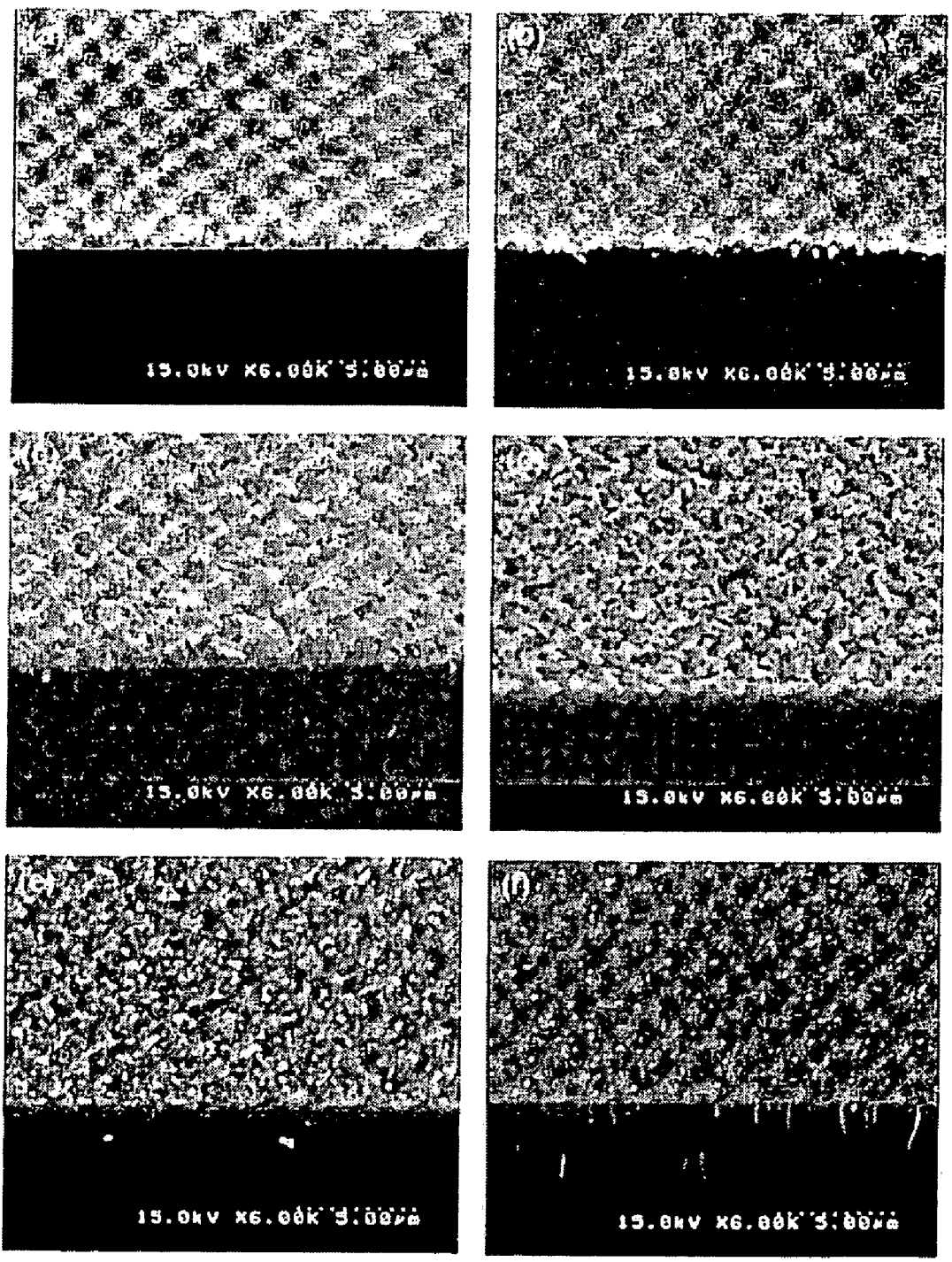
FIG. 3 is pictures illustrating the morphologies of the sacrificial layer of barium fluoride of the invention, which change with etching times.

Next, the dissolution rate of the sacrificial layer of barium fluoride was observed by holding the sacrificial layer in a suitable solvent at room temperature. FIG. 3 shows different morphologies of sacrificial layer of barium fluoride that change with etching time. FIG. 3 (a) shows the surface morphology of the sacrificial layer at the time when the sacrificial layer was deposited on the substrate, from which it is apparent that a sacrificial layer film was gradually removed according to etching times. This is considered because defective porous areas of the material were attacked first by an etching solution. The measured etching rate of the sacrificial layer in the solution was about 50 nm/min according to this observation. It should be understood, however, the etching rate of a solid material greatly depends on some conditions such as etching temperature, concentration of solution and stirring. In most cases of chemical etching, bubbles (or globular bodies of air or gas) are formed during chemical reaction between solid surface and solvent. These bubbles stick to patterned microstructural features to thereby prevent uniform etching. To solve this problem, stirring and/or surfactant are often used. However, in the experiments of the invention, bubbles were not formed in etching. This is considered one of important merits of the invention.

Nanowire Growth

The inventors carried out an experiment of growing and patterning nanowires according to the above-described process, for example, the process illustrated in FIG. 1. Other procedures except for conditions related to nanowire growth are consistent with those illustrated in FIG. 1. The conditions related to nanowire growth are reported in Table 1 below:

TABLE 1

| Growth conditions of ZnO nanowires (CVD) | Growth conditions of GaN nanowires (Furnace Method) | Growth conditions of Si nanowires (Furnace Method) |
| --- | --- | --- |
| Precursor: diethylzinc | Source: GaN | Source: SiO |
| Temp: 600-700° C. | Catalyst: Ni | Catalyst: Au |
| Distance between susceptor & nozzle: 1.5 cm | Source Temp: 1000-1200° C. | Source Temp: 1000-1200° C. |
| $O_2$ flow rate: 20 sccm | Distance between source & substrate: 7 cm | Distance between source & substrate: 5 cm |
| Ar flow rate: 50 sccm | Base pressure: 10 mTorr | Base pressure: 10 mTorr |
| N flow rate: 70 sccm | Working pressure: 150 mTorr | Working pressure: 150 mTorr |
| | Growth time: 30 mins | Growth time: 15 mins |
| | Atmosphere: $NH_3$ (35 sccm) | Atmosphere: Ar (15 sccm) |

As is well-known in the art, the furnace method is a method of growing nanowires on a substrate placed near a source material by evaporating the source material. Nanowires shown in the drawing are those grown by the Chemical Vapor Deposition (CVD).

Figure 4:
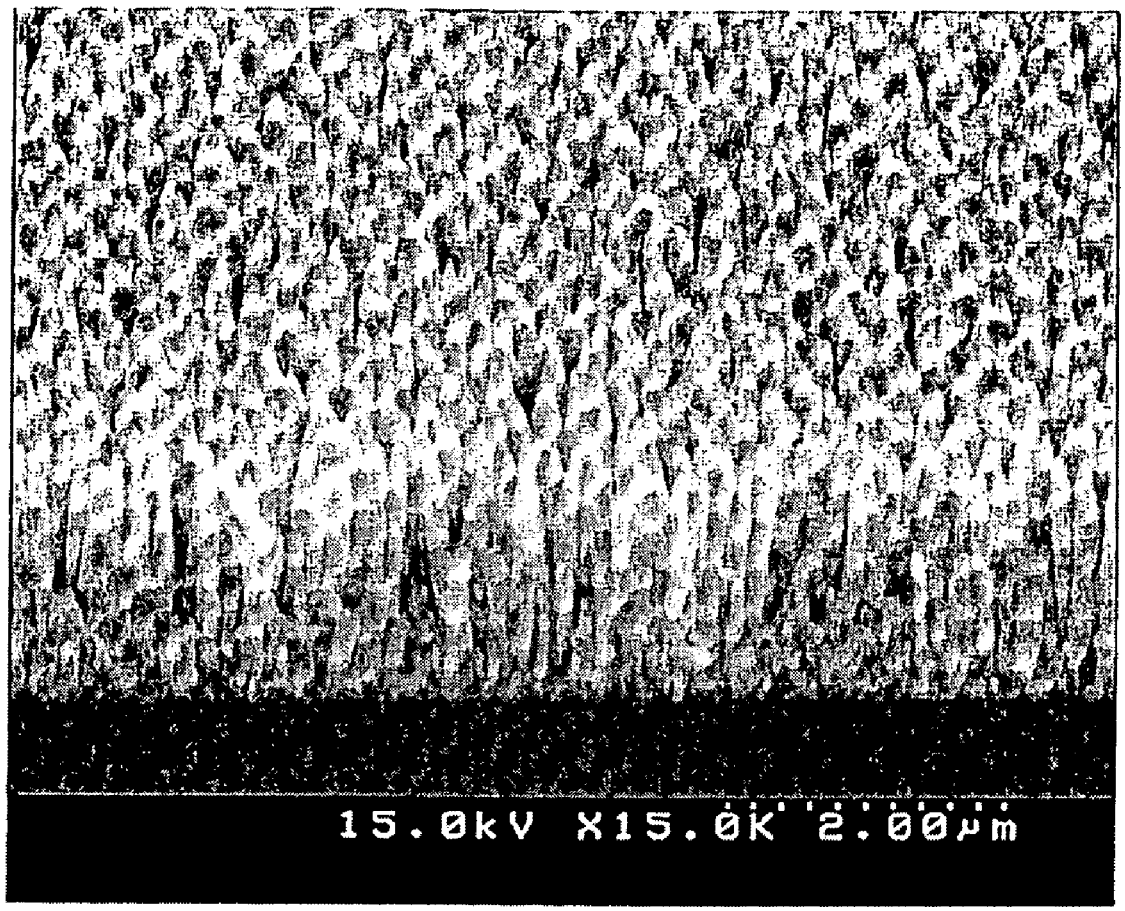
FIG. 4 is a FESEM picture of nanowires grown and patterned according to the invention.

In this experiment, the inventors grew and patterned nanowires according to the above-described process and then inspected nanowires gown by for example the MOCVD using a Field Emission Scanning Electron Microscope (FESEM). The result of this experiment is shown in FIG. 4. FIG. 4 shows that the grown nanowires can be used as an active material in a nanodevice. That is, another thin film or other nanowires can be grown a nanowire structure of the invention having uniform diameter and length so as to produce a nanodevice.

Figure 5:
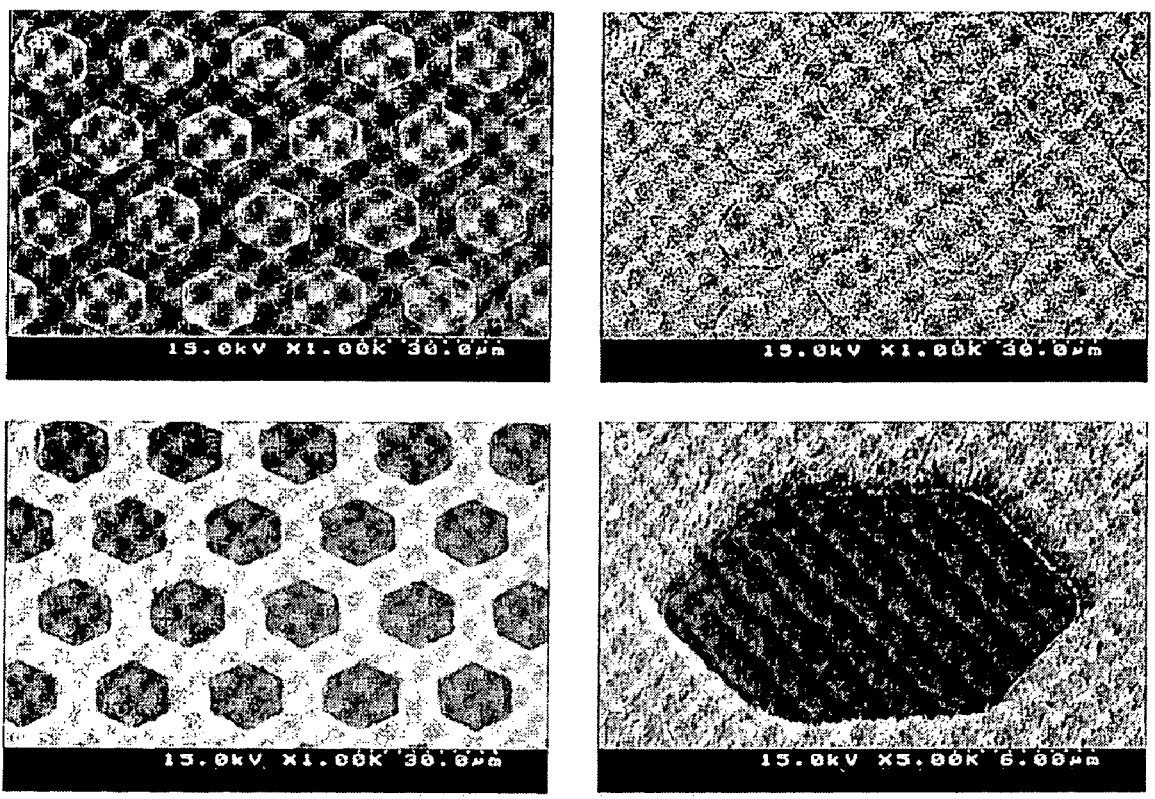
FIG. 5 is pictures of nanowires patterned into a hexagonal shape according to the invention.
Figure 6:
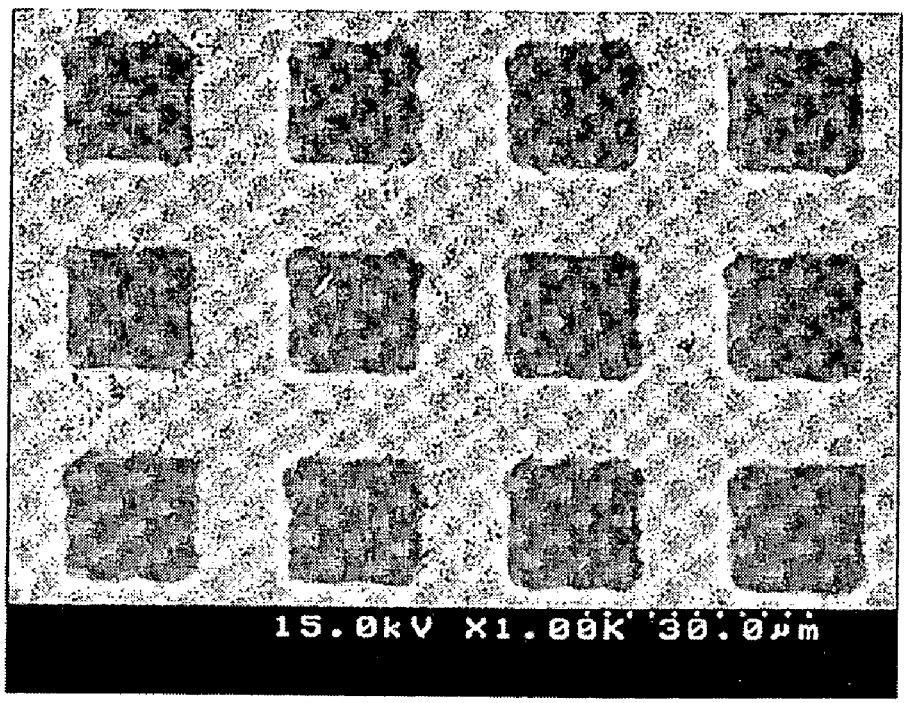
FIG. 6 is pictures of nanowires patterned into square and circular shapes according to the invention.
Figure 6:
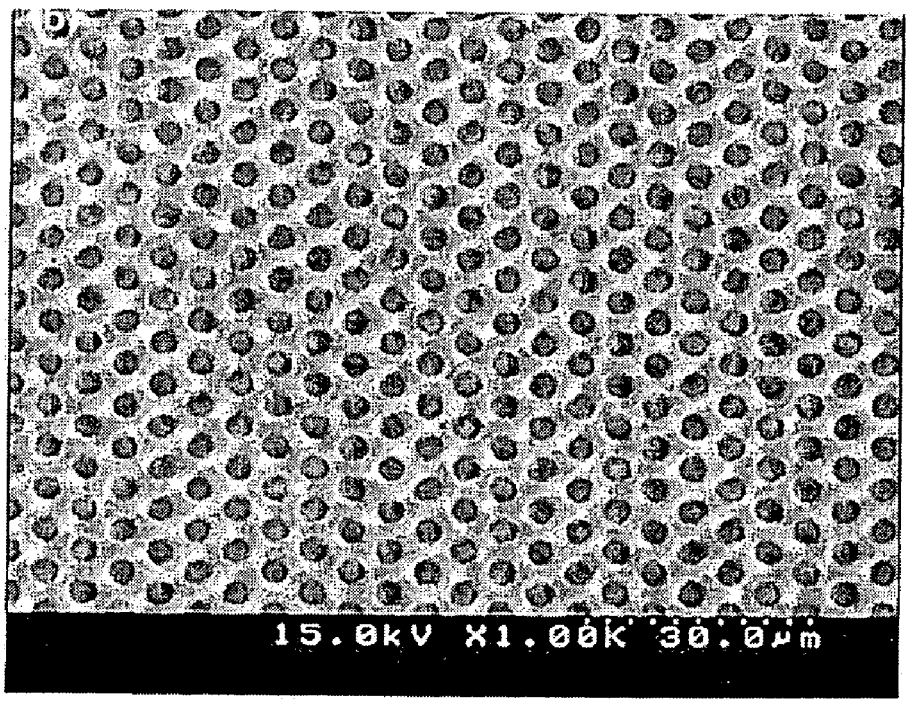

The inventors carried out the nanowire patterning through the above-described process, and checked whether or not the patterning was properly performed. The results are illustrated in FIG. 5. Pictures in FIG. 5 show that hexagonal patterns are correctly realized by the method of the invention. In addition to these hexagonal patterns, nanowires were also patterned into square and round shapes, and the results are illustrated in FIG. 6. From the pictures of the experimental results shown in FIGS. 5 and 6, it can be appreciated that nanowires can be grown and patterned into a variety of sizes and shapes by the method of the invention.

Figure 7:
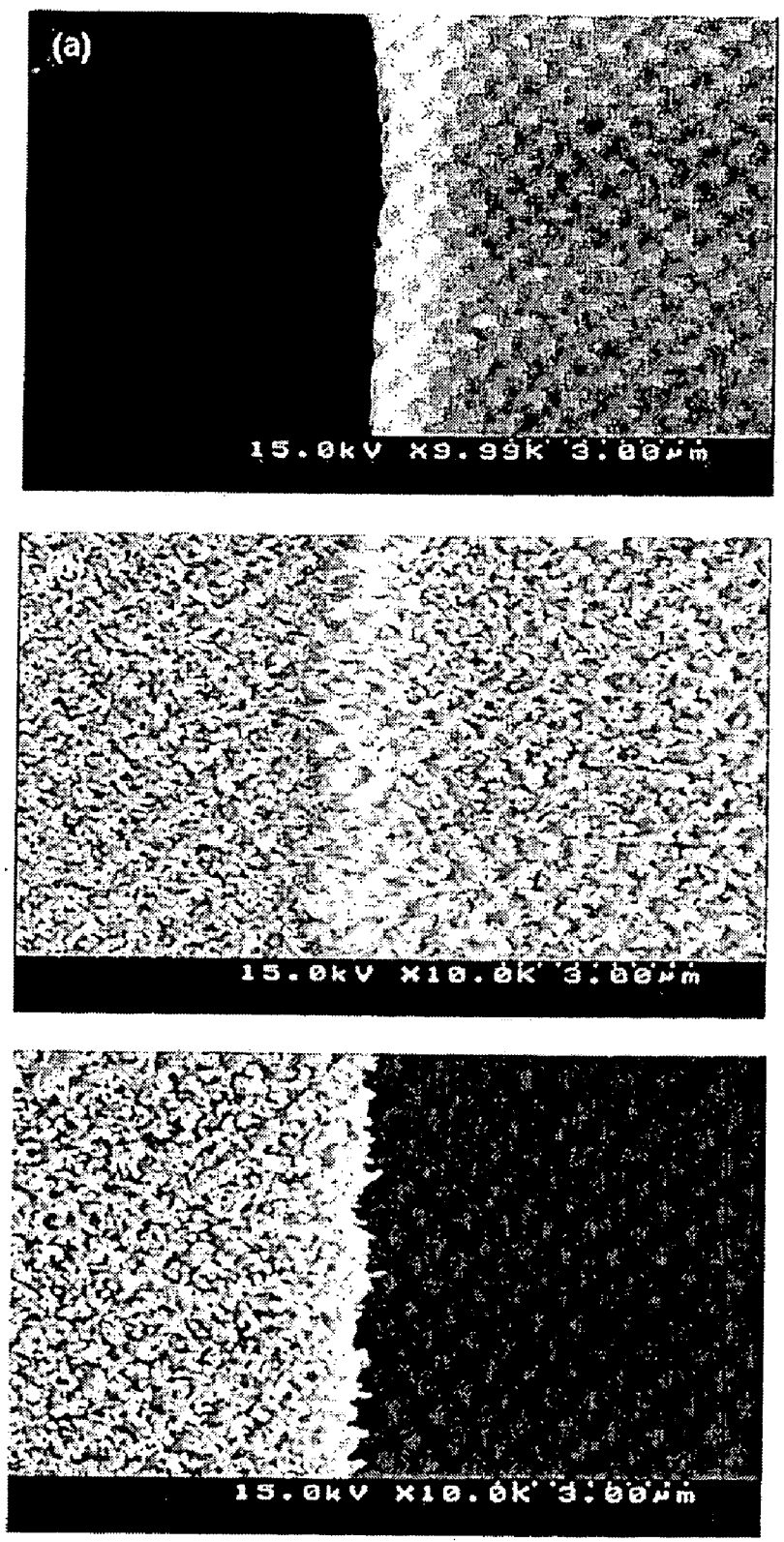
FIG. 7 is pictures of a substrate, a sacrificial layer of barium fluoride and nanowires in respective stages of a method of the invention.

The inventors also observed the surface morphologies of the substrate according to the respective stages as described above in order to confirm whether or not nanowires were grown and patterned according to the invention. The results are illustrated in FIG. 7. FIG. 7(a) shows a sacrificial layer of barium fluoride present on a partial area (right) of Si substrate (left). Then, ZnO nanowires were grown on the entire surface of the substrate including the sacrificial layer as shown in FIG. 7(b) (as for growth conditions, refer to Table 1 above). As a result, the sacrificial layer of barium fluoride was removed by a solvent (deionized water), and the ZnO nanowires remained only on the surface of the substrate as shown in the left part of FIG. 7(c). While all FIGS. 4 through 7 are the pictures related with the ZnO nanowires, the pictures related with GaN nanowires and Si nanowires are omitted since both the GaN nanowires and the Si nanowires have substantially the same patterning process as the ZnO nanowires.

It is to be understood that while the present invention has been illustrated and described in relation to the certain exemplary embodiments in conjunction with the accompanying drawings, such embodiments and drawings are illustrative only and that the present invention is in no event to be limited thereto. Rather, it is contemplated that modifications and equivalents embodying the scope of the appended claims will no doubt occur to those of skill in the art. It is therefore contemplated and intended that the invention shall be defined by the full spirit and scope of the claims appended hereto.

What is claimed is:

1. A method of patterning nanowire on a substrate, comprising the steps of:
preparing a substrate having a patterned sacrificial layer of barium formed thereon through the steps of:
coating a photoresist on a surface of the substrate;
patterning the photoresist on the surface of the substrate, thereby forming at least a first area on said substrate surface covered by the patterned photoresist and at least a second area on each substrate surface being exposed;
growing barium fluoride layer on said patterned photoresist on said at least first area and said exposed substrate surface on said at least second area by thermal deposition, thereby forming a sacrificial layer of barium fluoride; and
lifting-off said patterned photoresist and a portion of said sacrificial layer positioned at said at least first area, thus forming a patterned sacrificial layer of barium fluoride on said at least second area;
growing nanowires on the patterned sacrificial layer on said at least second area and on the exposed portion of said substrate surface on said at least first area of said substrate surface in a high-temperature environment at a temperature ranging from 600° C. to 1200° C.; and
removing the patterned sacrificial layer from said at least second area using a solvent to remove the nanowires grown on the patterned sacrificial layer, thereby leaving the nanowires grown in direct contact with the substrate surface on said at least first area thereof, thereby forming a nanowire pattern.

2. The method according to claim 1, wherein the patterned photoresist is removed by acetone.

3. The method according to claim 1, wherein the step of preparing the substrate further comprises the steps of:
growing barium fluoride on the surface of the substrate by thermal deposition to form said sacrificial layer of barium fluoride.

4. The method according to claim 1, wherein the step of preparing the substrate further comprises the steps of:
depositing barium fluoride on the surface of the substrate by chemical vapor deposition to form said sacrificial layer of barium fluoride.

5. The method according to claim 1, wherein the sacrificial layer of barium fluoride has a polycrystalline or amorphous surface.

6. The method according to claim 1, wherein the nanowires have a composition selected from the group consisting of ZnO, GaN and Si.

7. The method according to claim 6, wherein the nanowires are grown by chemical vapor deposition or furnace method.

8. The method according to claim 1, wherein the patterned sacrificial layer of barium fluoride is removed by deionized water.

9. A sacrificial layer used in a process for manufacturing of nanowires on a substrate, comprising the steps of:
   coating a photoresist layer on a surface of the substrate;
   patterning said photoresist layer, thereby forming at least one first and at least one second areas on said substrate surface, wherein said patterned photoresist remains in said at least one first area, and wherein said substrate surface is being exposed at said at least one second area;
   growing said sacrificial layer on said patterned photoresist at said at least one first area and on said exposed substrate surface at said at least one second area thereof;
   lifting-off said patterned photoresist from said at least one first area, thereby forming a patterned sacrificial layer at said at least one second area on said substrate surfaces, and exposing the substrate surface at said at least one first area thereof;
   growing nanowires in a high-temperature environment at a temperature ranging between 600° C. and 1200° C. on said exposed at least one first area of said substrate surface and on said patterned sacrificial layer at said at least one second area; and
   removing said patterned sacrificial layer from said at least one second area, thereby leaving said grown nanowires at said at least one first area of said substrate surface in direct contact therewith,
   wherein said sacrificial layer contains $BaF_2$.

10. The sacrificial layer material according to claim 9, wherein the sacrificial layer of barium fluoride is removed by a deionized water solvent.

11. The sacrificial layer material according to claim 9, wherein the sacrificial layer of barium chloride is stable to acetone.

* * * * *